(12) United States Patent
Griffin

(10) Patent No.: US 7,990,224 B2
(45) Date of Patent: Aug. 2, 2011

(54) DUAL REFERENCE PHASE TRACKING PHASE-LOCKED LOOP

(75) Inventor: Jed Griffin, Peyton, CO (US)

(73) Assignee: Atmel Corporation, San Jose, CA (US)

( * ) Notice: Subject to any disclaimer, the term of this patent is extended or adjusted under 35 U.S.C. 154(b) by 94 days.

(21) Appl. No.: 11/741,100

(22) Filed: Apr. 27, 2007

(65) Prior Publication Data

US 2008/0266001 A1 Oct. 30, 2008

(51) Int. Cl.
*H03L 7/00* (2006.01)

(52) U.S. Cl. ............ 331/1 A; 331/1 R; 331/11; 331/17; 331/14; 331/25

(58) Field of Classification Search ............ 331/1 A, 331/DIG. 2, 10–12, 14, 17–18, 25; 327/146–147, 327/155–156, 162–163
See application file for complete search history.

(56) References Cited

U.S. PATENT DOCUMENTS

| | | | |
|---|---|---|---|
| 4,464,638 A | | 8/1984 | Crowley et al. |
| 4,942,365 A | | 7/1990 | Satterwhite |
| 4,984,255 A | * | 1/1991 | Davis et al. .................. 375/354 |
| 5,315,269 A | * | 5/1994 | Fujii ............................. 331/1 A |
| 5,457,428 A | | 10/1995 | Alder et al. |
| 6,304,118 B1 | * | 10/2001 | Ikeno et al. .................. 327/159 |
| 6,590,457 B2 | * | 7/2003 | Schrodinger ................. 331/1 A |
| 6,741,109 B1 | | 5/2004 | Huang et al. |
| 7,151,814 B1 | * | 12/2006 | Kong et al. .................. 375/376 |
| 7,251,573 B2 | * | 7/2007 | Sanduleanu et al. ............ 702/79 |
| 7,266,172 B2 | * | 9/2007 | Hairapetian et al. .......... 375/376 |
| 7,405,628 B2 | * | 7/2008 | Hulfachor et al. .............. 331/11 |
| 2006/0242445 A1 | | 10/2006 | Aweya et al. |

FOREIGN PATENT DOCUMENTS

| | | |
|---|---|---|
| EP | 1885067 A2 | 2/2008 |
| GB | 2335322 | 9/1999 |
| JP | 2001-0044827 | 2/2001 |
| WO | WO-2008/133899 A1 | 11/2008 |

OTHER PUBLICATIONS

M.E. Lee et al., "Jitter Transfer Characteristics of Delay-Locked Loops—Theories and Design Techniques", IEEE J. of Solid-State Circuits, vol. 38, No. 4, Apr. 2003, pp. 614-621.
"International Application Serial No. PCT/US2008/005223, Search Report mailed Jul. 24, 2008" 6 pages.
"International Application Serial No. PCT/US2008/005223, Written Opinion mailed Jul. 24, 2008" 5 pages.

* cited by examiner

*Primary Examiner* — James H. Cho
*Assistant Examiner* — Christopher Lo
(74) *Attorney, Agent, or Firm* — Fish & Richardson P.C.

(57) ABSTRACT

A phase-locked loop circuit having a dual-reference input and a phase detector. The dual-reference input is configured to accept both a rising edge of an input clock having a first phase and a falling edge of the input clock having a second phase. The phase detector is coupled to the dual-reference input and is configured to produce a center phase signal based upon and centered in phase between the first and second phases. The phase detector is further configured with a feedback loop to adjust any tracking error and provide a tracking output signal. The phase detector system maintains both a high tracking bandwidth and a bounded jitter amplification based as a result of the dual reference signal. The high tracking bandwidth and the bounded jitter amplification are independent of an applied loop gain.

13 Claims, 6 Drawing Sheets

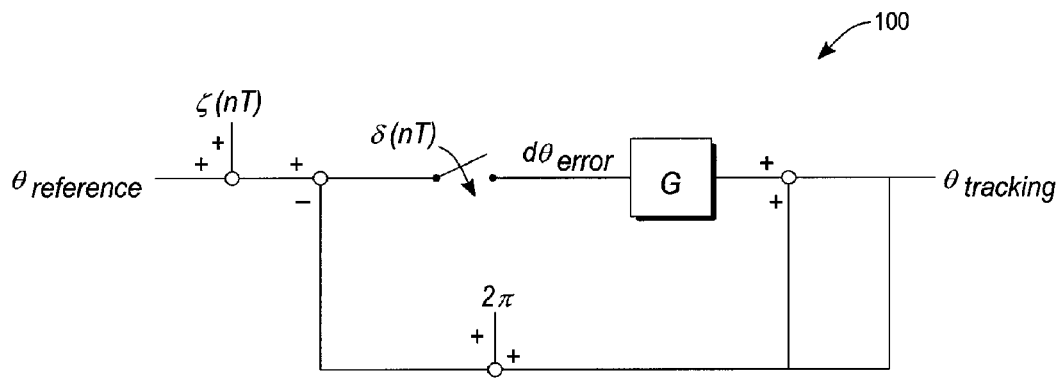
Fig. 1A *(Prior Art)*
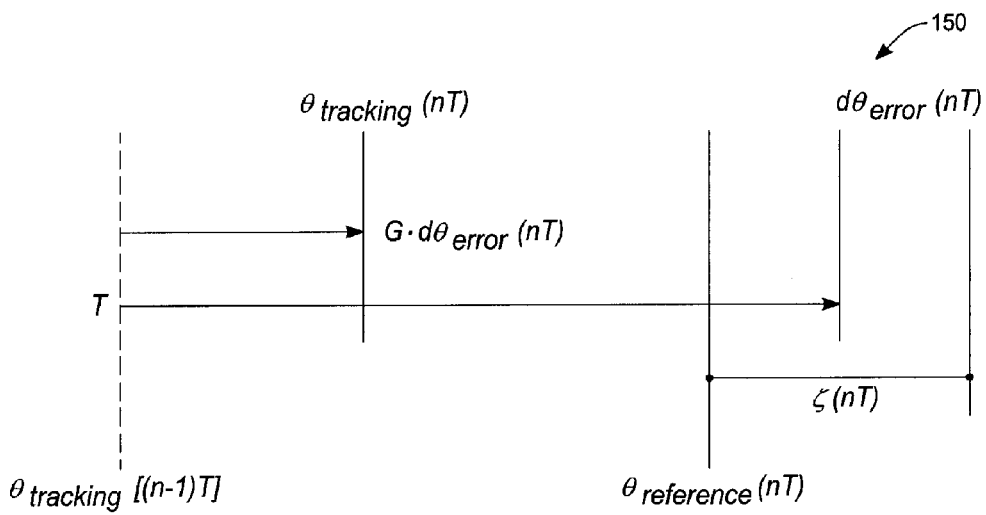
Fig. 1B *(Prior Art)*

DUAL REFERENCE PHASE TRACKING PHASE-LOCKED LOOP

TECHNICAL FIELD

The invention relates generally to phase-locked loops. More specifically, the invention relates to a phase-locked loop having dual reference inputs and to a method of operating the phase-locked loop.

BACKGROUND ART

Phase-locked loop (PLL) designs have traditionally relied on single-reference (SR) phase tracking. The SR phase tracking is therefore only capable of tracking a single reference phase. The single reference phase is generally defined as either a rising or falling edge on an incoming reference clock. In traditional designs of the prior art, ideal behavior is for the tracking phase to track exactly a fixed tracking distance (typically $2\pi$) behind the reference phase, even when the reference phase shifts up to a high rate of change from cycle to cycle. A high tracking bandwidth is necessary to accommodate a high rate of change. High tracking bandwidth is achieved when the tracking phase moves the same distance and in the same direction as the reference phase. This "unity tracking" ideally continues with a high rate of change on the reference phase.

To achieve a high tracking bandwidth, and resulting fast acquisition times, a high loop gain is required. Unfortunately, the required high loop gain also amplifies any shifts in the incoming reference. The amplified shifts result in amplified jitter rather than an expected unity shift on the tracking phase. This phenomenon is referred to as jitter peaking. Jitter peaking becomes more pronounced as the frequency of shifts on the reference approaches the reference frequency.

To avoid the detrimental effects of jitter peaking in practical SR circuit design, high tracking bandwidth is sacrificed by adding loop filtering to dampen or reduce the high loop gain. Loop filtering therefore effectively reduces jitter peaking. However, loop filtering also results in low tracking bandwidth (and a concomitant long acquisition time) and increased jitter accumulation through the feedback loop due to lower gain.

This inherent conflict between jitter peaking and tracking bandwidth in SR phase tracking dictates that either a high tracking bandwidth goal or a low jitter peaking goal can be achieved. However, both goals cannot be achieved simultaneously.

In FIG. 1A, a closed-loop SR model 100 helps illustrate the closed-loop behavior of SR tracking. A sample shift on the incoming reference phase, $\theta_{reference}$, is denoted as $\zeta$ and an open-loop gain value is denoted as G. An impulse function $\delta$ depicts the discrete-time sampling of SR tracking at T sample intervals (where T is the period of the reference clock) and n represents a particular sample interval over an indefinite number of samples.

Derived from FIG. 1A, equation (1) below reveals that the first derivative of tracking (indicative of tracking bandwidth) is not proportional to the rate of change of any induced jitter, as would be expected from ideal behavior. Rather, the tracking derivative is proportional to the jitter (or input shift) itself. For example, the reference jitter may have peaked and started to decrease, but tracking would be showing no jitter.

$$\theta'_{tracking}(t) = f_{reference} G \left[ \theta_{reference}(t) - \theta_{tracking}\left(t - \frac{1}{f_{reference}}\right) \right] - \quad (1)$$

$$2\pi f_{reference} G + f_{reference} G \zeta(t)$$

As the phase error ($\theta_{reference} - \theta_{tracking}$) goes to $2\pi$ (the tracking distance), the tracking has converged and equation (1) simplifies to equation (2) where only jitter (i.e., input shift) is being tracked. A high tracking bandwidth would track jitter (or real reference change) with unity gain up to a high rate of change. One difficulty can be seen in equation (2) in that any input shift is amplified by the closed-loop gain G and $f_{reference}$.

$$\theta_{tracking}'(t) = f_{reference} G \zeta(t) \quad (2)$$

Another difficulty in achieving high tracking bandwidth is further obvious from a summation of impulse functions (the impulse functions are denoted by $\zeta$ in equation (2)). An impulse function, a single shift of the reference phase on one clock cycle, shows that whatever amplitude the reference phase shifts to would be a phase shift at the tracking phase amplified by G and $f_{reference}$. Accumulating these amplified shifts, as they vary across multiple cycles, leads to jitter peaking, or large jitter shifts occurring on the tracking phase. FIG. 1B displays a related tracking diagram.

The improbability of getting an exact match between the tracking phase moving in a monotonic correspondence with the reference phase is obvious from using various functions of $\zeta$ in equation (2). An impulse function, a single shift of the reference phase on one clock cycle, would suffice to illustrate jitter amplification. Whatever amplitude the reference phase shifts to would be amplified by G and $f_{reference}$. Also, note that accumulating these amplified shifts across multiple cycles leads to jitter peaking, or much larger jitter shifts occurring on the tracking phase than on the reference phase. This is the main reason loop filtering is used—to keep G low, thereby reducing jitter peaking and SR tracking. However, as pointed out above, loop filtering also results in low tracking bandwidth and increased jitter accumulation.

Therefore, what is needed is a way to concurrently decrease jitter peaking and increase tracking bandwidth in a PLL design.

SUMMARY

In one exemplary embodiment, the invention is a phase-locked loop having a dual-reference input and a phase detector. The dual-reference input is configured to accept both a rising edge of an input clock having a first phase and a falling edge of the input clock having a second phase. The phase detector is coupled to the dual-reference input and is configured to produce a center phase signal based upon and centered in phase between the first and second phases. The phase detector is further configured with a feedback loop to adjust any tracking error and provide a tracking output signal.

In another exemplary embodiment, the invention is a method of operating a phase-locked loop circuit. The method includes providing a first and a second reference signal. The first reference signal has a first phase and is based on a rising edge of a clock signal. The second reference signal has a second phase and is based on a falling edge of the clock signal. A center tracking signal is produced. The center tracking signal has a center phase being based upon and centered between the first phase and the second phase. The center tracking signal provides a comparison reference for locking both a phase and a frequency of the phase-locked loop circuit.

In another exemplary embodiment, the invention is a phase-locked loop having a dual reference input. The dual-reference input is configured to accept both a rising edge of an input clock having a first phase and a falling edge of the input clock having a second phase. A phase detector is coupled to the dual reference input and is configured to both produce a center phase signal and compare an oscillator signal to the center phase signal. The phase detector is further configured to provide a tracking output signal where the tracking output signal corresponding to the center phase.

In another exemplary embodiment, the invention is phase-locked loop circuit comprising a voltage controlled oscillator circuit, a phase detector system, and a feedback path. The voltage controlled oscillator is configured to generate an output signal based on an applied tuning signal. The phase detector system is configured to generate a closed-loop control signal in a closed-loop mode that is a function of a comparison between a feedback signal and a dual reference signal. The dual reference signal is based upon an application of both a rising edge of an input clock having a first phase and a falling edge of the input clock having a second phase. The phase detector system is further configured to generate a tracking phase based upon both phases of the dual reference signals. The feedback path is configured to transmit the closed-loop control signal that is a function of the output signal from the voltage controlled oscillator circuit to an input of the phase detector system.

BRIEF DESCRIPTION OF THE DRAWINGS

FIG. 1A is a closed-loop model of a prior art single-reference (SR) phase-locked loop.

FIG. 1B is a tracking diagram of the closed-loop model of FIG. 1A.

DETAILED DESCRIPTION

Disclosed herein are a method and exemplary embodiments of resulting circuits produced by that method for a dual-reference (DR) phase tracking phase-locked loop (PLL) device. The PLL device utilizes both rising and falling edges of an incoming reference clock as two independent reference phases with a tracking phase centered between the two. A resulting higher stability accrues from using both phases of the reference clock which provides both higher tracking bandwidth and bounded jitter amplification.

Dual-Reference Phase Tracking

Figure 2A:
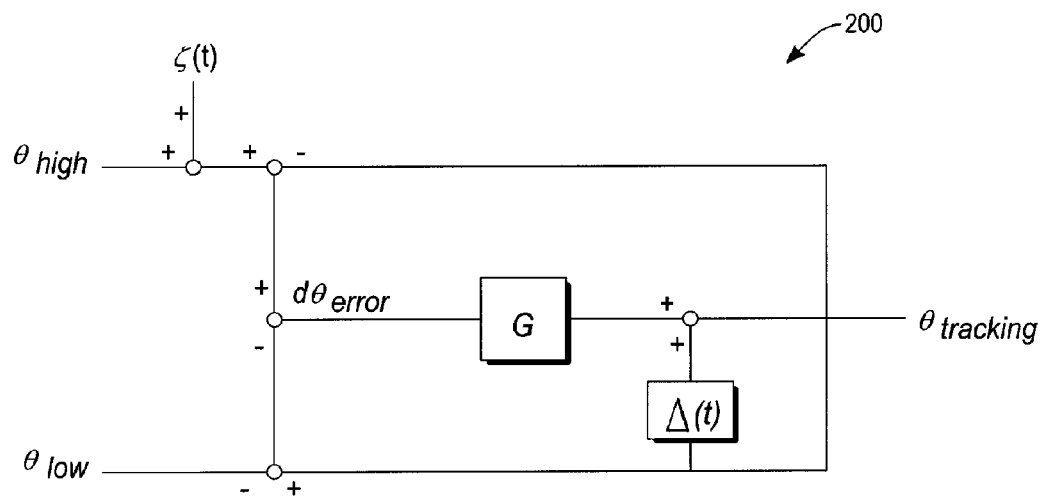
FIG. 2A is an exemplary closed-loop model of a dual-reference (DR) phase-locked loop in accordance with an embodiment of the present invention.

With reference to FIG. 2A, an exemplary closed-loop model 200 for dual-reference (DR) tracking is useful in illustrating fundamental principles of enhanced phase tracking achievable with embodiments of the DR tracking method. A sample shift on one of the incoming reference phases, $\theta_{high}$, is denoted as $\zeta$ and an open-loop gain value is denoted as G. In comparison with the prior art single-reference (SR) tracking which is only capable of relying upon a single phase (typically corresponding to a rising edge of the reference clock and tracking one cycle behind), DR tracking utilizes both rising and falling edges of the reference clock as two separate references. The tracking phase is centered between the two references. Two references provide greater stability and serve to bound jitter whereas one reference phase cannot bound jitter. Graphical representations of bounded jitter will be described in detail, below. Further, the effect of bounded jitter is demonstrated both mathematically and empirically herein and thus verifies DR tracking does eliminate the SR design trade-off between tracking bandwidth and jitter peaking. Thus, the greater stability from using both phases of the reference clock for tracking can intuitively be observed to provide both higher tracking bandwidth with greater stability and bounded jitter amplification.

Equation (3), below, is derived from the exemplary closed-loop model 200 for dual-reference (DR) tracking and illustrates a relationship of output tracking phase, $\theta_{tracking}$, to the two reference phases, $\theta_{high}$ and $\theta_{low}$, and loop gain value, G.

$$\theta_{tracking}(t) = \frac{1}{\frac{1-\Delta(t)}{2G}+1}\left[\theta_{center}(t) + \frac{\zeta(t)}{2}\right] \quad (3)$$

where $$\Delta(t) = 1 - \frac{Gd\theta}{\theta_{tracking}(t)};$$

and $$\theta_{center}(t) = \frac{\theta_{high}(t) + \theta_{low}(t)}{2}$$

Figure 2B:
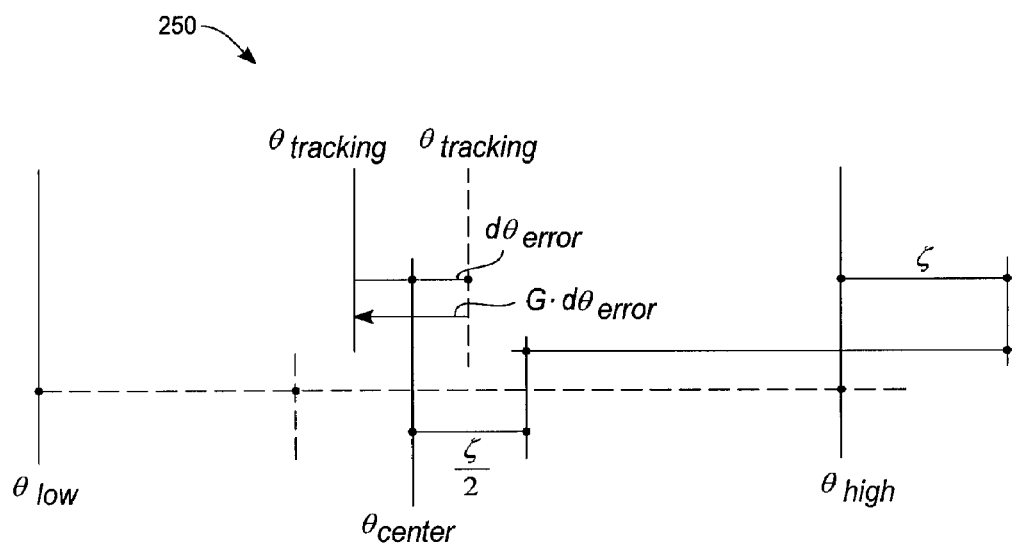
FIG. 2B is a tracking diagram of the closed-loop model of FIG. 2A.

Essentially, a one-to-one (i.e., monotonic) tracking exists between the tracking phase and the reference phase. The time-continuous sampling resulting from DR tracking allows it to approach much nearer to ideal phase tracking. For example, an impulse jitter on one clock cycle only, would result in a shift of half the distance in the tracking phase, without jitter amplification. This effect is shown graphically in the DR tracking diagram 250 of FIG. 2B.

Notable in equation (3) is an advantageous relationship of loop gain, G, to the tracking phase, $\theta_{tracking}$, as a result of DR tracking. As G increases, the desired higher tracking bandwidth and faster acquisition time is achieved. Significantly however, the tracking also becomes independent of G. With a large G, DR tracks exactly as it should—half of the instantaneous shift from one reference occurs on the tracking phase while the second reference is held constant. In contrast to SR tracking, which is adversely and proportionally impacted as G increases, DR tracking becomes increasingly less dependent on G as G increases. The classic SR trade-off of tracking bandwidth to jitter peaking is thus eliminated by using DR tracking.

In equation (4), the first derivative of $\theta_{tracking}$ in equation (3) mathematically shows that as loop gain becomes sufficiently large, the derivative of the tracking is half the derivative of the input shifts, exactly as expected.

$$\theta'_{tracking}(t) = \frac{\zeta'(t)}{\frac{1-\Delta(t)}{G}+2} \quad (4)$$

-continued where $$\theta'_{tracking}(t) = \frac{\zeta'(t)}{2} \text{ as } G \to \infty.$$

For example, an impulse, such as an instantaneous input shift, results in a shift of half the distance on the tracking phase, without jitter amplification. Thus, the time continuous sampling resulting from DR tracking allows it to approach ideal phase tracking. The net effect is that DR tracking provides much tighter phase locking than SR tracking.

Figure 3A:
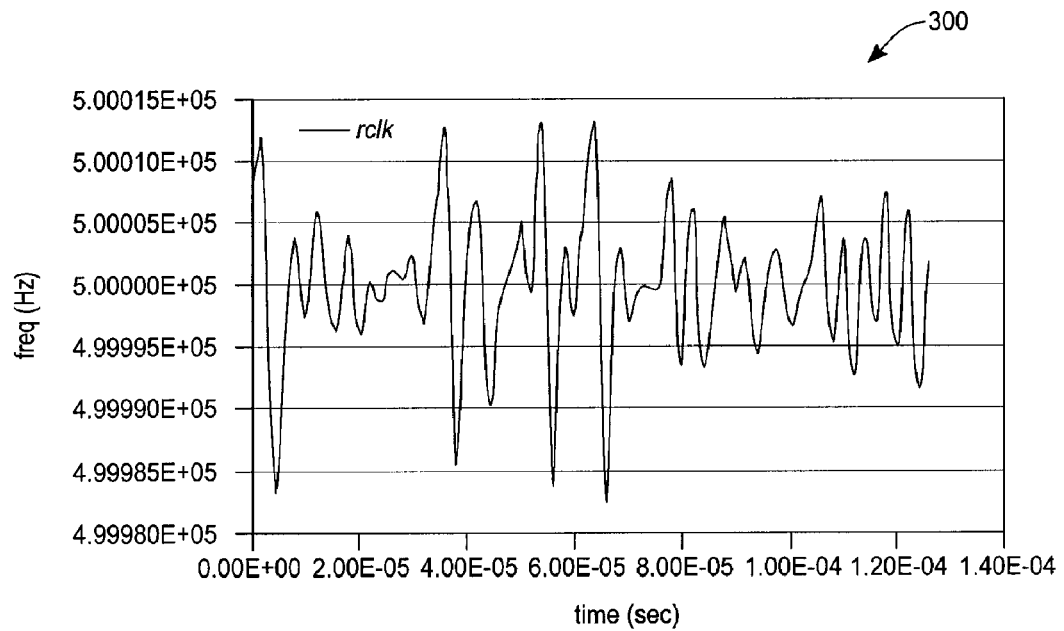
FIGS. 3A-3C are graphical comparison plots of jitter transfer for a given reference clock input under both prior art SR tracking and DR tracking of the present invention.
Figure 3B:
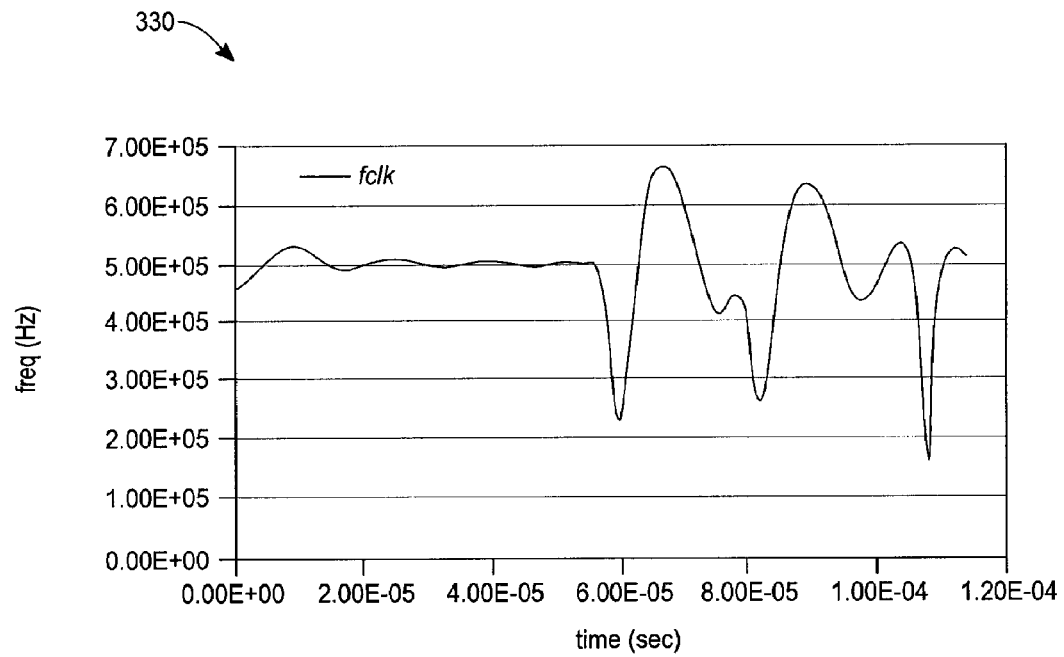
Figure 3C:
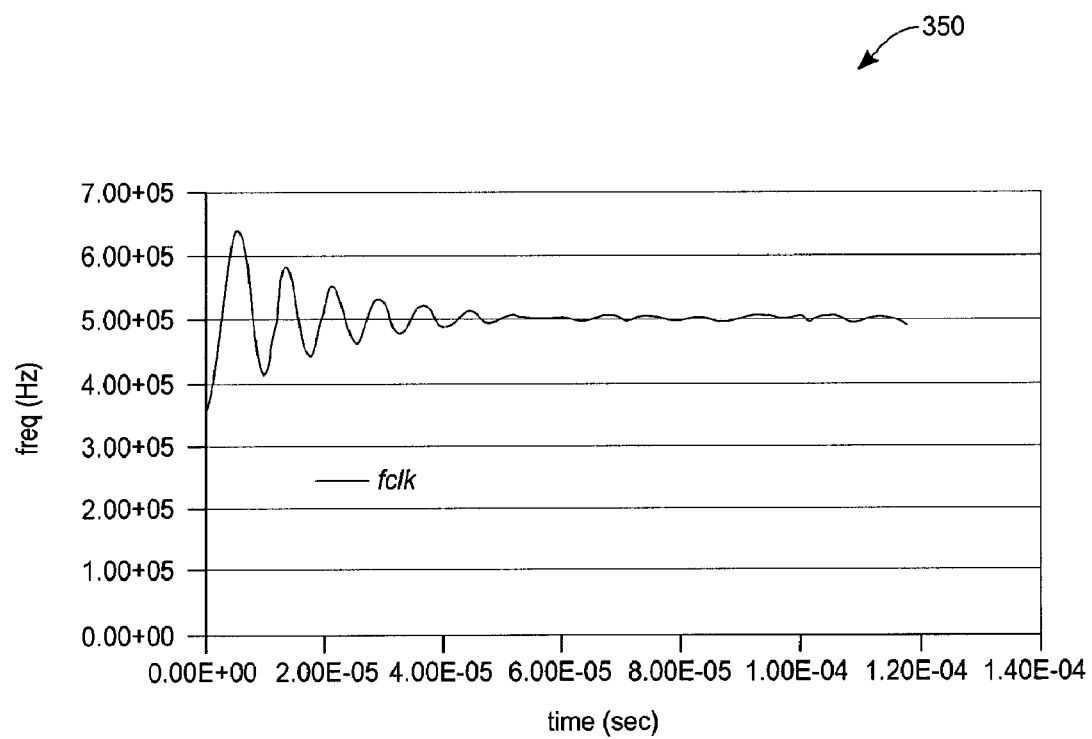

FIGS. 3A-3C indicate the stability possible with DR tracking with an equivalent or even higher loop gain relative to SR tracking. With concurrent reference to FIGS. 3A-3B, a graph 300 of a reference clock with jitter indicates frequency distribution as a function of time. FIG. 3B indicates a tracking clock with SR tracking 330 of the prior art. Notice that even after 120 microseconds, there is still significant tracking error present with little sign of damping. In contrast, a tracking clock with DR tracking 350 in FIG. 3C indicates significant damping within less than 60 microseconds. Therefore, DR tracking indicates significantly higher stability with the same higher loop gain relative to SR tracking.

Dual Reference PLL Schematic

A dual reference PLL circuit may be implemented by defining a phase/frequency detection that allows tracking to the center of two reference phases. The phase comparison is performed by detecting a difference between the center phase (i.e., the mid-point between both tracking phases) and the first phase of the tracking clock to occur between the reference phases.

Figure 4A:
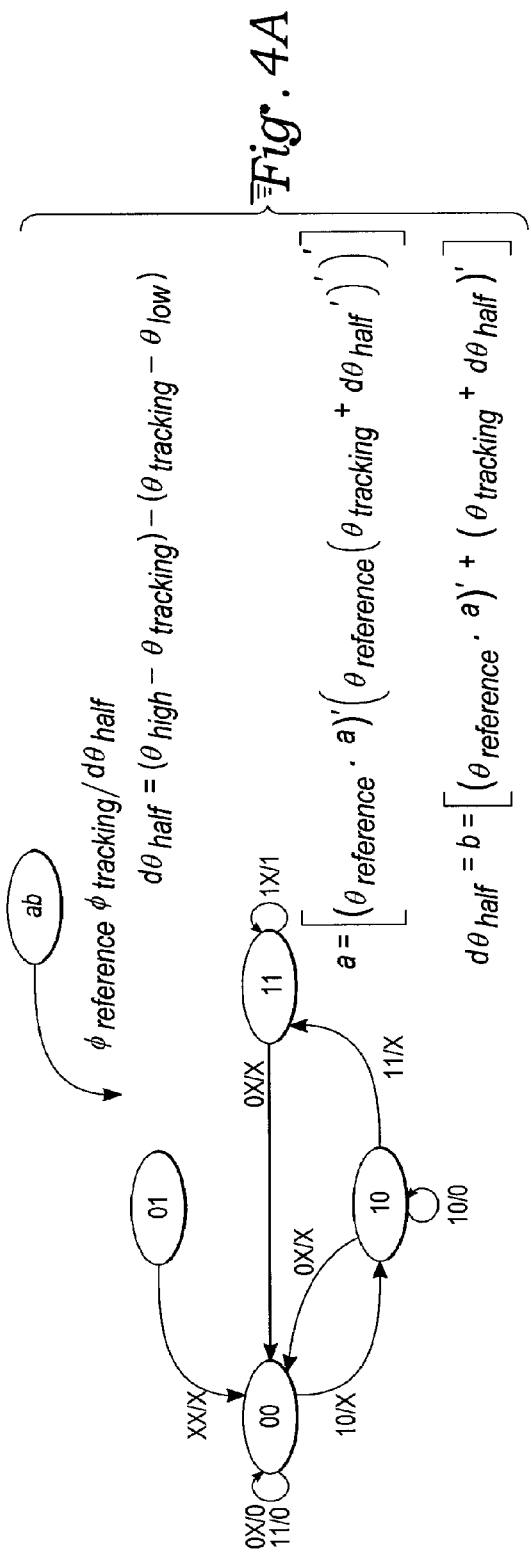
FIG. 4A is finite state machine diagram of half cycle phase and frequency detection states.

With reference to FIG. 4A, an exemplary state machine allows a skilled artisan to produce a DR tracking PLL circuit. As is recognizable to a skilled artisan, the exemplary state machine defines a type of Mealy state machine which has outputs, z, that are a function of state, q, and input, i. In the state machine diagram, "ab" is a current machine state and "yy/y" may be interpreted as "input condition(s)/output condition" where "X" is a don't care condition. Thus, outputs are determinable from a present state and a set of input conditions. Mathematically, this may be simply expressed as:

$$z = f(q_{k-1}, q_{k-2}, \ldots, q_0; x_{m-1}, x_{m-2}, \ldots, x_0)$$

where $\phi_{reference} \phi_{tracking}$ are input conditions and $d\theta_{half}$ is the output condition. Equations in the state machine diagram for "a" and "b" are written in Boolean logic with the rules of Boolean algebra applying.

Figure 4B:
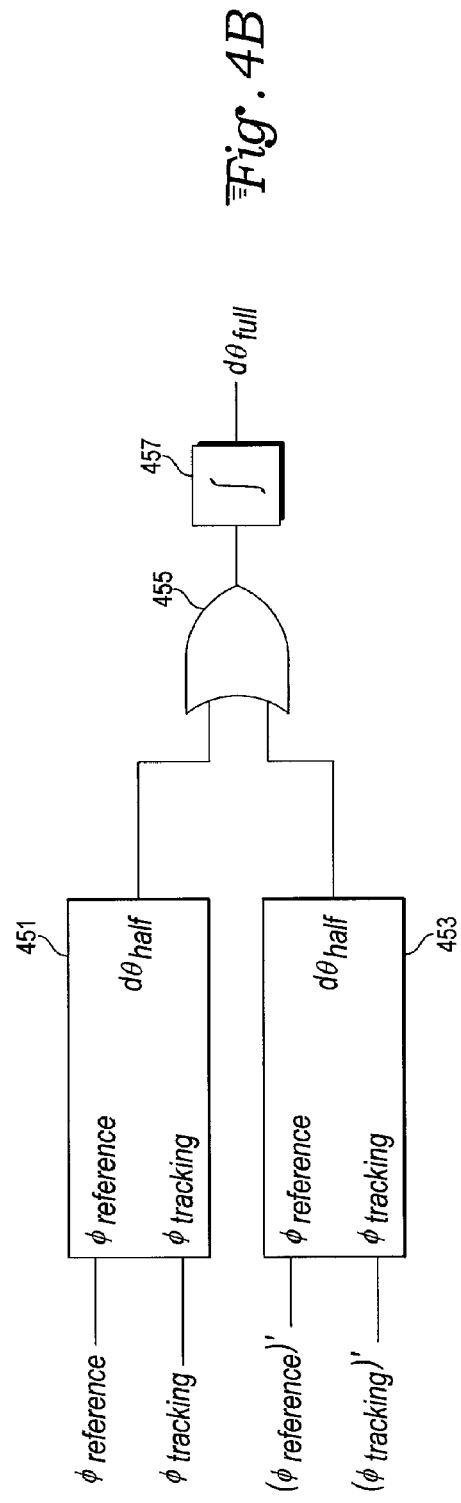
FIG. 4B is an exemplary embodiment of a pseudo-schematic diagram of a DR phase comparator or phase/frequency detection circuit in accordance with the present invention.

The state machine defines an exemplary half cycle phase/frequency detection. FIG. 4B provides an exemplary pseudo-schematic diagram indicating phase detection on both half cycles with time-continuous sampling. For example, outputs of a first combinational logic element 451 and a second combinational logic element 453 may be combined in an OR gate 455. The output of the OR gate 455 is then input to an integrator 457 which defines tracking bandwidth, producing a $d\theta_{full}$ output. Such a circuit can be assembled from the state machine as shown in FIG. 4A (a skilled artisan will recognize that the first 451 and second 453 combinational logic elements are each instantiations of the exemplary state machine of FIG. 4A).

Figure 5:
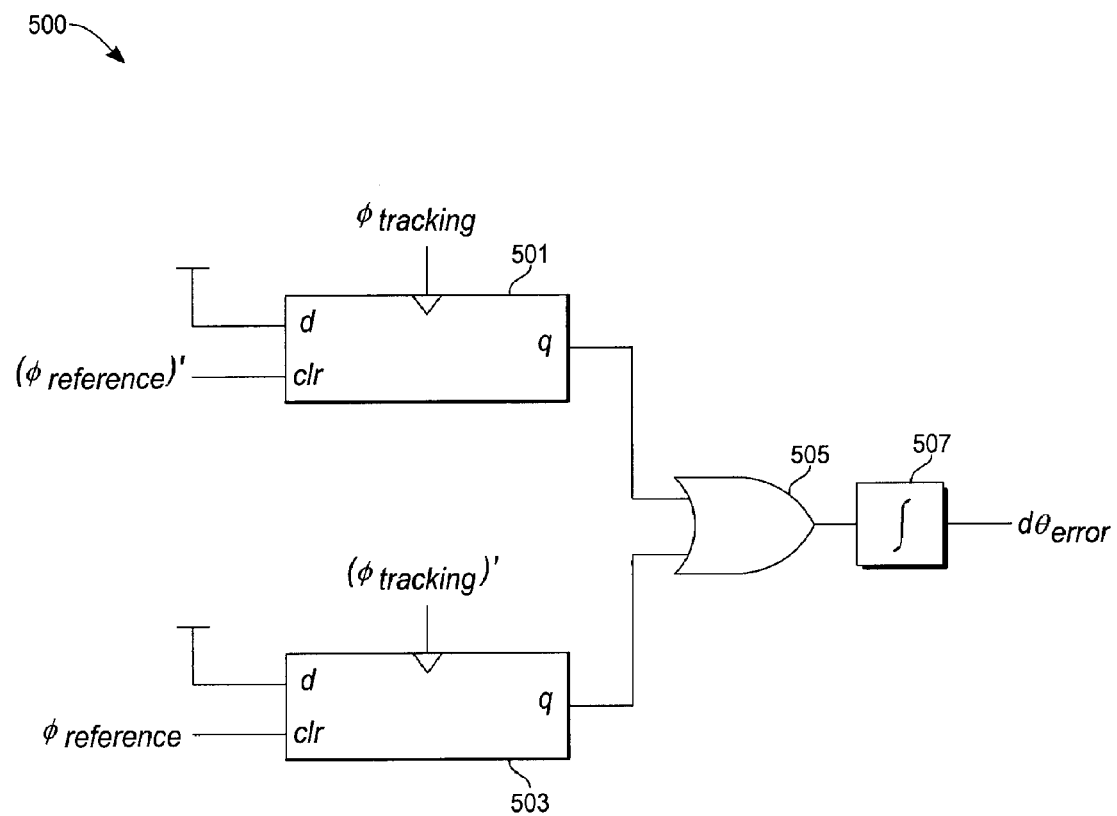
FIG. 5 is an exemplary embodiment of a practical DR phase comparator or phase/frequency detection circuit in accordance with the present invention.

In FIG. 5, an exemplary embodiment of a practical implementation of a circuit 500 is also derived from the state machine diagram of FIG. 4A. In the circuit 500, a first D-type flip flop 501 and a second D-type flip flop 503 each receive one of the two phase inputs, $(\phi_{reference})'$ and $\phi_{reference}$ with enables occurring upon application of $\phi_{tracking}$ and $(\phi_{tracking})'$ respectively. An OR gate 505 combines outputs from the first 501 and second 503 D-type flip flops producing an input to an integrator 507 which defines tracking bandwidth, producing a $d\theta_{error}$ output. As described in more detail below, the tracking clock is adjusted such that $d\theta_{error}$ or approaches zero. Other circuits may be readily designed on the same principle of operation, based on the disclosure herein and the state machine of FIG. 4A.

As a skilled artisan will readily recognize, the DR phase detection methodology and circuitry described herein may readily be implemented in a PLL circuit by adding an appropriate charge pump and related components. Alternatively, the DR phase connection scheme may connect directly to a voltage controlled oscillator, thus minimizing devices coupled in series and reducing jitter accumulation. Further, software programs exist to convert any finite state machine into, for example, flip flops and logic gates required to implement a physical circuit.

Generally, operation of the DR tracking circuit can be defined as waiting until the reference clock goes high with the output or phase error going to high (signaling that the frequency or phase needs to increase). Only on the first transition of the tracking clock to high will the output then transition low (signaling that the frequency or phase needs to decrease) and remain low for the remainder of the time the reference clock is high. If the first tracking phase occurs before the center phase, the tracking clock is too fast and integration of the output will signal an overall decrease in clock frequency. In contradistinction, if the first tracking phase occurs after the center phase, the integrated output will signal an overall increase in clock frequency. Such feedback will continue until no net increase or decrease in frequency is detected and the phase tracking will have converged to the center phase. The probability of the first tracking phase occurring before the center phase across two adjacent sample windows is shown in equation (5), below.

$$P(d\theta_{error} > 0) = \begin{cases} \dfrac{f_{tracking}}{2f_{reference}} & \text{for } f_{tracking} < 2f_{reference} \\ 1 & \text{for } f_{tracking} \geq 2f_{reference} \end{cases} \quad (5)$$

Mathematically, a skilled artisan will recognize there is an equal probability of being on both sides of the center phase when $f_{reference}$ equals $f_{tracking}$, tracking a hence ensuring convergence to the center phase. While there is a remote possibility that a starting frequency is a multiple of the reference frequency and, were phases to align, an incorrect lock could occur. However, any possibility of frequency aliasing can be prevented entirely by starting at lower frequencies.

The time-continuous sampling resulting from DR tracking closely approximates ideal phase tracking. Specifically, the DR tracking method allows loop gain to be set much higher than possible under the prior art without any risk of jitter peaking. The higher gain allows higher tracking bandwidths and faster acquisition times. The higher loop gain further minimizes jitter accumulation through the feedback loop resulting in tighter phase locking. An incidental advantage is a shorter tracking distance of $\pi/2$ rather than $2\pi$. The shorter tracking distance further translates into additional stability and less jitter accumulation. In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that circuits defined are exemplary only and that equivalent or similar circuits may be implemented based on the methodologies and governing equations presented herein. Further, even thought the exemplary state machine was described as a Mealy-type implementation, a skilled artisan will recognize that complex methods exist to transform Mealy state machines into Moore-type state machines with equivalent Moore circuits. The specification and drawings are, accordingly, to be regarded in an illustrative rather than a restrictive sense.

What is claimed is:

1. A phase-locked loop circuit comprising:
   a dual-reference input configured to accept both a rising edge of an input clock having a first clock phase and a falling edge of the input clock having a second clock phase; and
   a phase detector coupled to the dual-reference input, the phase detector configured to produce a center phase signal based upon and centered in phase between the first clock phase and the second clock phase, the phase detector configured with a feedback loop to adjust a tracking error and provide a tracking output signal, wherein the phase detector is configured to maintain both a high tracking bandwidth and a bounded jitter amplification as a result of producing the center phase signal based upon and centered in phase between the first clock phase and the second clock phase, the high tracking bandwidth and the bounded jitter amplification being independent of an applied loop gain.

2. The phase-locked loop circuit of claim 1 wherein the phase detector comprises a pair of logic devices, each of the pair of logic devices having an output coupled to an OR gate, an output of the OR gate being coupled to an integrator, the integrator configured to define a tracking bandwidth and produce an output signal based upon any error between a reference signal and a tracking signal.

3. The phase-locked loop circuit of claim 2 wherein the pair of logic devices comprises a pair of flip flops.

4. The phase-locked loop circuit of claim 3 wherein each of the flip flops is a D-type flip flop.

5. A method of operating a phase-locked loop circuit, the method comprising:
   providing a first reference signal, the first reference signal having a first clock phase and based on a rising edge of a clock signal;
   providing a second reference signal, the second reference signal having a second clock phase and based on a falling edge of the clock signal; and
   producing a center tracking signal, the center tracking signal having a center phase being based upon and centered between the first clock phase and the second clock phase, the center tracking signal providing a comparison reference for locking both a phase and a frequency of the phase-locked loop circuit; and
   maintaining both a high tracking bandwidth and a bounded jitter amplification as a result of producing the center tracking signal being based upon both the first and second reference signals, the high tracking bandwidth and the bounded jitter amplification being independent of an applied loop gain.

6. The method of claim 5 further comprising:
   detecting a difference between the center phase and an average of the first clock phase and the second clock phase; and
   adjusting an output tracking phase to correspond with the center phase.

7. The method of claim 5 wherein a centering of the center tracking signal occurs on both first and second portions of the clock signal with alternating references between the first and second reference signals.

8. A phase-locked loop circuit comprising:
   a dual-reference input configured to receive a first clock signal having a first clock phase and a second clock signal having a second clock phase; and
   a phase detector coupled to the dual-reference input and configured to produce a signal having a center phase based upon and centered between the first clock phase and the second clock phase, wherein the phase detector is configured to maintain both a high tracking bandwidth and a bounded jitter amplification as a result of producing the signal having the center phase based upon and centered between the first clock phase and the second clock phase, the high tracking bandwidth and the bounded jitter amplification being independent of an applied loop gain.

9. The phase-locked loop circuit of claim 8 wherein the phase detector comprises:
   a first logic device having a first input to receive the first clock signal and a second input to receive a first tracking signal;
   a second logic device having a first input to receive the second clock signal and a second input to receive a second tracking signal; and
   a third logic device responsive to an output of the first logic device and an output of the second logic device.

10. The phase-locked loop circuit of claim 9 wherein the first logic device includes a first flip flop, the second input of the first logic device corresponds to a clock input of the first flip flop, and wherein the second logic device includes a second flip flop, the second input of the second logic device corresponds to a clock input of the second flip flop.

11. The phase-locked loop circuit of claim 10 wherein the third logic device includes a logic gate having a first logic gate input coupled to an output of the first flip flop and a second logic gate input coupled to an output of the second flip flop.

12. The phase-locked loop circuit of claim 1 wherein the feedback loop is configured to provide an additional tracking signal, wherein the tracking signal is provided to a first additional input of the phase detector, and the additional tracking signal is provided to a second additional input of the phase detector.

13. The phase-locked loop circuit of claim 9, wherein the first tracking signal includes a first additional clock signal different from the first clock signal at the first input of the first logic device, and the second tracking signal includes a second additional clock signal different from the second clock signal at the first input of the second logic device.

* * * * *

UNITED STATES PATENT AND TRADEMARK OFFICE
CERTIFICATE OF CORRECTION

PATENT NO. : 7,990,224 B2  Page 1 of 1
APPLICATION NO. : 11/741100
DATED : August 2, 2011
INVENTOR(S) : Jed Griffin It is certified that error appears in the above-identified patent and that said Letters Patent is hereby corrected as shown below:

Column 6, line 5, after "$d\theta_{error}$" delete "or".

Column 6, line 47, after "$f_{tracking}$," delete "tracking a".

Signed and Sealed this
Twenty-fifth Day of October, 2011

David J. Kappos
*Director of the United States Patent and Trademark Office*